(12) United States Patent
Weber et al.

(10) Patent No.: US 9,269,774 B2
(45) Date of Patent: Feb. 23, 2016

(54) ELECTRONIC DEVICE

(75) Inventors: Heiko B. Weber, Erlangen (DE); Michael Krieger, Röthenbach (DE); Stefan Hertel, Roth (DE); Florian Krach, Veitsbronn (DE); Johannes Jobst, Fürth (DE); Daniel Waldmann, Lambsheim (DE)

(73) Assignee: Friedrich-Alexander-Universität Erlangen-Nürnberg, Erlangen (DE)

( * ) Notice: Subject to any disclaimer, the term of this patent is extended or adjusted under 35 U.S.C. 154(b) by 0 days.

(21) Appl. No.: 14/124,274

(22) PCT Filed: Jun. 18, 2012

(86) PCT No.: PCT/EP2012/002572
§ 371 (c)(1),
(2), (4) Date: Mar. 6, 2014

(87) PCT Pub. No.: WO2012/171665
PCT Pub. Date: Dec. 20, 2012

(65) Prior Publication Data
US 2014/0225066 A1    Aug. 14, 2014

(30) Foreign Application Priority Data

Jun. 17, 2011 (EP) .................... 11004981

(51) Int. Cl.
*H01L 29/49* (2006.01)
*H01L 29/16* (2006.01)
*H01L 21/04* (2006.01)
(Continued)

(52) U.S. Cl.
CPC ........ *H01L 29/1606* (2013.01); *H01L 21/0485* (2013.01); *H01L 21/0495* (2013.01); *H01L 21/8213* (2013.01); *H01L 21/84* (2013.01); *H01L 27/0605* (2013.01); *H01L 27/0629* (2013.01); *H01L 27/1203* (2013.01); *H01L 28/22* (2013.01); *H01L 28/40* (2013.01); *H01L 29/41758* (2013.01); *H01L 29/42316* (2013.01); *H01L 29/45* (2013.01); *H01L 29/47* (2013.01); *H01L 29/66143* (2013.01);
(Continued)

(58) Field of Classification Search
CPC combination set(s) only.
See application file for complete search history.

(56) References Cited

U.S. PATENT DOCUMENTS 3,780,320 A * 12/1973 Dorler et al. .................. 257/476
3,849,789 A * 11/1974 Cordes et al. ................. 257/475
(Continued)

OTHER PUBLICATIONS

Tongay, S. et al., "Tuning Schottky Diodes at the Many-Layer-Graphene/Semiconductor Interface by Doping," Carbon Elsevier Science Ltd., vol. 49, No. 6, May 2011, pp. 2033-2038.
(Continued)

*Primary Examiner* — Michael Shingleton
(74) *Attorney, Agent, or Firm* — Mendelsohn Dunleavy, P.C.; Steve Mendelsohn

(57) ABSTRACT

An electronic device (1) includes a semiconductor substrate (3) having a front surface (7), a first electrode (8) and a second electrode (9) disposed on the front surface (7) of the substrate (3), wherein the first electrode (8) and the second electrode (9) each have at least one epitaxial graphene monolayer (10). The at least one epitaxial graphene monolayer (10) of the first electrode (8) forms an ohmic contact with the substrate (3) and the at least one epitaxial graphene monolayer (10) of the second electrode (9) forms a Schottky barrier with the substrate (3).

24 Claims, 9 Drawing Sheets

(51) Int. Cl.
*H01L 21/82* (2006.01)
*H01L 27/06* (2006.01)
*H01L 49/02* (2006.01)
*H01L 29/417* (2006.01)
*H01L 29/423* (2006.01)
*H01L 29/45* (2006.01)
*H01L 29/47* (2006.01)
*H01L 29/66* (2006.01)
*H01L 29/812* (2006.01)
*H01L 29/872* (2006.01)
*H01L 21/84* (2006.01)
*H01L 27/12* (2006.01)

(52) U.S. Cl.
CPC ........... *H01L 29/812* (2013.01); *H01L 29/872* (2013.01); *H01L 29/1608* (2013.01)

(56) References Cited

U.S. PATENT DOCUMENTS

| 4,214,251 | A | * | 7/1980 | Schairer | 257/99 |
| 4,443,808 | A | * | 4/1984 | Kihara et al. | 257/479 |
| 5,047,826 | A | * | 9/1991 | Keller et al. | 257/379 |
| 5,905,294 | A | * | 5/1999 | Kushida | 257/409 |

OTHER PUBLICATIONS

Giannazzo, F. et al., "Lateral Uniformity of the Transport Properties of Graphene/4H-SiC (0001) Interface by Nanoscale Current Measurements," Materials Research Society Symposium Proceedings, vol. 1205, Nov. 30, 2009, 6 pages.

Xiaosong, W. et al., "The Epitaxial-Graphene/Graphene-Oxide Junction, an Essential Step Towards Epitaxial Graphene Electronics," Physical Review Letters, American Physical Society, New York, US, vol. 101, No. 2, 7, Jul. 2008, pp. 1-5.

* cited by examiner

ELECTRONIC DEVICE

BACKGROUND

1. Field of the Invention

The present invention relates to an electronic device having a first electrode and a second electrode disposed on the front surface of a semiconductor substrate, wherein the first electrode and the second electrode each comprises at least one epitaxial graphene monolayer. More specifically, the invention relates to an integrated circuit with silicon carbide (SiC) as semiconductor substrate and graphene layers on that substrate.

2. Description of the Related Art

Monolithic integrated circuits are electronic circuits manufactured on one semiconductor substrate, comprising connected electronic devices like transistors, diodes, capacitors and resistors. Today, integrated circuits are mainly manufactured on the basis of Silicon (Si). However, other semiconductor materials may have advantages for specific application areas like high frequency or high power applications.

Silicon carbide for example with a band gap of approximately 3 eV has advantages for switching and controlling high power. Current technical applications of Silicon carbide are based on the principle of MOSFET's, JFET's or bipolar transistors. For such devices the silicon carbide substrate is doped with p-type and with n-type impurities.

In the WO 2005/001895 A2 an electronic device is disclosed, having a silicon carbide substrate and at least two graphene electrodes disposed on the surface of the substrate. In particular a transistor element is shown constructed by a graphene source electrode, a graphene drain electrode and a graphene gate electrode. These electrodes are disposed on the surface of the silicon carbide substrate. The drain electrode and the source electrode are bridged by a thin graphene strip. The gate electrode adjoins the thin graphene strip. Using the field effect the graphene in the thin strip is gated by applying a voltage to the graphene gate electrode.

In addition, the WO 2009/158552 A2 discloses an electronic device constructed by graphene electrodes disposed on the surface of a silicon carbide substrate. The graphene of the electrodes is chemically modified. Graphene itself is gated as a thin strip also using the field effect.

Graphene as a single layer or monolayer of graphite shows an excellent carrier mobility as well as an excellent ampacity. However, graphene exhibits no band gap; graphene is not a semiconductor. Graphene shows metallic conductivity. Due to the lack of a sufficiently large band gap, gating the graphene will therefore not result in an acceptable on/off-ratio of respective active devices. The on/off-ratio is increased when using a thin graphene strip or by chemical modification of the graphene layers, where both methods result in disadvantages like the requirement of cryogenic operation temperatures or slow switching frequencies.

SUMMARY

Therefore, there is a need for an electronic device using graphene electrodes, which overcomes the mentioned disadvantages and is easy to fabricate.

According to the invention the addressed problem is solved by an electronic device comprising a semiconductor substrate with a front surface, a first electrode and a second electrode both disposed on the front surface of the substrate. The first electrode and the second electrode each comprises at least one epitaxial graphene monolayer, wherein the at least one epitaxial graphene monolayer of the first electrode is forming an ohmic contact with the substrate and the at least one epitaxial graphene monolayer of the second electrode is forming a Schottky barrier with the substrate.

The invention in a first step notices that based on the excellent electrical transport properties of graphene in active electronic devices graphene itself is used for the gated current path. Surprisingly, the invention is leaving this way and is using graphene electrodes for a current injection into the substrate. The current between the graphene electrodes is not flowing through graphene; the current between the graphene electrodes flows through the substrate.

The new surprising concept of the invention allows using the excellent electrical properties of graphene without having the disadvantages of a low on/off-ratio due to the missing or small band gap of graphene. Instead the large band gap of the semiconducting substrate is employed. The current flow between two graphene electrodes is gated or controlled by changing the physical properties of the interface between the graphene and the substrate.

For controlling the substrate current between graphene electrodes, the invention is using two types of graphene. The first type of graphene, the so-called "contact graphene", shows an ohmic contact with or into the substrate. The second type of graphene, the so-called "gate graphene", exhibits a Schottky barrier with or into the substrate. The first type of graphene allows a current flow between the graphene and the substrate as well as within the graphene itself. The second type of graphene allows a current flow within the graphene but a current flow between the graphene and the substrate will only be allowed if a respective voltage is applied to the graphene. The Schottky barrier between the second type of graphene and the substrate acts as a unidirectional diode. In addition, the Schottky barrier between the second type of graphene and the substrate according to the invention is used for controlling or gating the current path through the substrate. Depending on the applied voltage, the depletion layer of the Schottky diode underneath the second type of graphene is increased or decreased, thereby spatially varying the current path through a conductive layer within the substrate.

The first type of graphene or contact graphene is already known. This type of graphene for example is prepared by thermal decomposition of silicon carbide. However, also other preparation methods of contact graphene are conceivable. Heating a silicon carbide substrate to temperatures above the sublimation temperature of silicon (for example to 1700° C. in an Argon atmosphere) will result in the sublimation of silicon due to the lower vapor pressure of carbon as compared to silicon. After heating, the surface of the silicon carbide substrate exhibits one or few monolayers of epitaxial graphene. Preparation of contact graphene on the surface of silicon carbide for example is known from Nature Materials, Konstantin V. Emtsev, "Towards wafer-size Graphene Layers by Atmospheric Pressure Graphitization of Silicon carbide", Vol. 8, March 2009, p. 2003 to 2007. Epitaxial contact graphene preferably is prepared on the hexagonal (0001)-surface of the 6H-polytype of silicon carbide. However, other polytypes of silicon carbide and other surface orientations are also useable for the preparation of contact graphene layers. Also multi-crystalline silicon carbide may be used. Since defects in the crystal would increase leakage currents, low grain sizes are not preferred.

According to own investigations epitaxial contact graphene on silicon carbide shows a carrier mobility of 29.000 cm$^2$/Vs and a carrier density of $1*10^{13}$ cm$^{-2}$. Defects in the substrate will not considerably change these electrical properties. The ampacity of epitaxial graphene is around j=4 mA/µm. The conductivity of the graphene layer will increase when using more than one graphene layer stacked up to a graphitic layer. The injection barrier of contact graphene on silicon carbide is low.

According to one embodiment of the invention the second type of epitaxial graphene or gate graphene is prepared from the first type of epitaxial graphene by atomic intercalation. Allowing an appropriate atom or molecule to diffuse between the contact epitaxial graphene layer and the substrate might result in a graphene layer, which is quasi free standing on the surface of the substrate. The interface between the quasi free standing graphene layer and the semiconductor substrate exhibits a Schottky barrier according to a metal-semiconductor-junction.

It is the main concept of the invention to have at least two electrodes on the surface of the substrate, wherein one of these electrodes comprises at least one epitaxial contact graphene monolayer, and the other electrode comprises at least one epitaxial gate graphene monolayer. The contact graphene layer shows an ohmic contact with the substrate. The gate graphene layer and the substrate are forming a Schottky diode. For preparation of the graphene layer showing an ohmic contact with the substrate and of a graphene layer forming a Schottky barrier with the substrate the use of other methods as currently known and described are possible; the invention is not limited to specific preparation methods. It is the ohmic contact and the Schottky barrier, which characterize the two types of graphene on the surface of the substrate.

In case of preparing a contact graphene by thermal decomposition of silicon carbide, a structural analysis shows a carbon buffer layer between the first epitaxial graphene monolayer and the substrate. Part of the carbon atoms of the carbon buffer layer are chemically connected to silicon carbide by $sp^3$ bonds, while the majority of carbon atoms of the carbon buffer layer are $sp^2$ bonded within the layer. Within the epitaxial graphene monolayer the carbon atoms are arranged in a hexagonal pattern where each atom is chemically connected to its three neighbors by $sp^2$ bonds. Crystalline graphite consists of stacked graphene layers. Some of the $sp^3$ bonds of the surface of the substrate are so-called unsaturated dangling bonds. The electron in the valence shell is not shared with a carbon atom. Again it is pointed out, that the buffer layer and the dangling bonds are features according to a preferred embodiment of the invention. Also other structural features of the interface between a graphene monolayer and a substrate may result in an ohmic contact between the graphene layer and the substrate.

Preferably gate graphene is prepared by atomic intercalation of contact graphene. Thereby useful atoms or molecules may saturate thereby the dangling bonds of the surface of the substrate. However, the carbon buffer layer changes by atomic intercalation into a graphene monolayer, where the carbon atoms are connected with $sp^2$ bonds with their three neighbors. This converted graphene monolayer is quasi free standing on the surface of the substrate. When preparing gate graphene by atomic intercalation of contact graphene an intercalated atomic layer is disposed between the first epitaxial graphene monolayer and the surface of the substrate. At the interface between the gate graphene layer and the substrate a Schottky barrier will result.

Own investigations show that diffusion controlled hydrogen intercalation of contact graphene by disposing the substrate for approximately 75 min in a hydrogen atmosphere at approximately 900 mbar at a temperature between 300° C. and 600° C. will result in a conversion of approximately 0.5 μm wide graphene strips to gate graphene. Variations in temperature and time of the intercalation process do not show any indication for a lower size limit. Larger areas of contact graphene will not be converted. Schottky contacts of gate graphene prepared by hydrogen intercalation on silicon carbide show a clear rectifying behavior and Schottky barrier heights up to 1.6 eV. Recently it has been investigated, that also atomic intercalation with Fluor and Gold will convert contact graphene into gate graphene. And also appropriate other metals might be able to convert contact graphene.

One possible preparation method of gate graphene is to convert contact graphene for example by hydrogen intercalation. However, it should be noted that it is also possible to convert gate graphene back into contact graphene. This is done for example by heating the quasi free-standing gate graphene and converting it back to a carbon buffer layer. If gate graphene has been prepared by hydrogen intercalation, the hydrogen will evaporate by local annealing above 900° C. For the preparation of patterned contact graphene local laser heating of gate graphene is preferred.

It is therefore possible to prepare patterned graphene layers on the semiconductor substrate by converting contact graphene to gate graphene or gate graphene to contact graphene locally. The manufacturing of these semiconductor devices is therefore simplified.

The proposed semiconductor device is fully compatible with other semiconductor devices based on silicon carbide using the field effect for gating graphene and also with pure silicon carbide electronics and pure graphene electronics for high frequency applications. Integrated electronics based on a semiconductor device according to the invention have further several advantages over prior art, these include: Integrated electronic device structures can be prepared parallel on a single waver; preparation of integrated electronic devices is possible using standard micro electronics lithography methods; preparation is possible with at least one single lithography step; graphene acts as a diffusion barrier blocking defects from the semiconductor substrate; high field strengths at edges are avoided due to the flat graphene layers; feature sizes as small as 1 μm scale are possible; there is no fundamental upper limitation of the feature size; operation under high temperature conditions and under harsh chemical and radiant environment is possible.

Preferably the semiconductor substrate is doped with impurities, wherein the impurity concentration within the semiconductor substrate varies in/along a vertical direction. In order to gate or to control the current flow through the substrate by applying a voltage to the second electrode, a current path near the surface of the substrate is preferred. A spatial expansion of the current path or a conductive layer into the bulk is avoided by varying the concentration of the impurities along a vertical direction.

According to one embodiment of the invention, the substrate is doped alternately with n-type and p-type impurities along the vertical direction. On each n-p-junction a depletion layer or a space charge region is formed thereby limiting the horizontal depth of a conductive layer within the substrate. By applying a voltage to the second electrode the depletion layer will be changed allowing gating of the horizontal current flow through the substrate.

According to another preferred embodiment of the invention along the vertical direction the semiconductor substrate comprises at least a first zone adjoining the front surface and a second zone at a distance from the front surface, wherein the substrate in the first zone and in the second zone is differently doped with impurities. Choosing the concentration of the impurities in the first zone different from the concentration of the impurities in the second zone moves the position of the depletion layer (along a vertical direction). If the concentration of the impurities in the first zone is lower as compared to the concentration of the impurities in the second zone, the depletion layer is moved towards the surface of the substrate. The n-type conductive layer in the first zone of the substrate is therefore narrowed in vertical direction.

The invention allows constructing "normally on"-devices as well as "normally-off"-devices. If the conductive layer according to the depletion zone of a vertical n-p-junction is sufficiently narrowed in vertical direction, the Schottky barrier of a gate graphene layer on the surface may completely narrow down the current path and a "normally-off"-device results. Applying a slightly positive voltage to the gate graphene layer reduces the depth of the Schottky depletion layer and a horizontal current flow becomes allowed.

Having a smaller depletion layer of the vertical n-p-junction within the substrate will result in a broader conductive layer underneath the surface of the substrate. The Schottky barrier of a gate graphene layer disposed on the surface is not able to stop a horizontal current flow through the conductive layer. However, if a negative voltage is applied to the gate graphene layer the depth of the Schottky depletion layer will increase and the current flow within the horizontal current path will be narrowed down. Having designed a smaller depletion layer will therefore result in a "normally-on"-device.

According to a further embodiment of the invention the substrate is doped with n-type impurities in the first zone and is doped with p-type impurities in the second zone. This embodiment takes the advantage that a contact graphene layer shows the lowest injection barrier with regard to n-type silicon carbide. Own investigations for example show a low contact resistance of $6*10^{-6}$ $\Omega$ cm$^2$ between a contact graphene layer and an n-type doped silicon carbide substrate in case the surface area of the silicon carbide substrate is n-type-doped with Nitrogen (N) atoms at a concentration of $10^{19}$ cm$^{-3}$. This contact resistance is comparable with contact resistances of state of the art metal contacts to highly doped silicon carbide. Alternatively, the substrate in the second zone is not doped with p-type impurities but is prepared to become semi-insulating. N-type doped silicon carbide (naturally due to the presence of N-atoms) for example is doped with vanadium, which traps electrons as major carriers in the n-type silicon carbide.

Yet according to another embodiment of the invention the substrate comprises an additional electrode (for example a back electrode), which is connected to the second zone. Applying a voltage to the back electrode allows moving the depletion layer of the vertical n-p-junction in the substrate vertically. With an additional (back) electrode it is therefore possible to switch one single device according to the invention between a "normally on" and a "normally off" state.

It is not necessary to have an impurity concentration varying in the substrate in/along a horizontal direction. However, a horizontal variation of the impurity concentration allows a local variation of the depletion layer of an n-p-junction within the substrate. Thereby, the electrical transport properties of locally positioned graphene elements could be changed and adapted. For example, depending on its lateral position, the same graphene structure is changed between a "normally on" and a "normally off" device by varying the impurity concentration in lateral direction. Also crossings of a graphene layer and a current path within the substrate are imaginable. Increasing the impurity concentration in the substrate locally at the crossing point for example will decrease the gate effect of a crossing gate graphene thereby allowing a defined "crosstalk" between the graphene electrode and the current path below. According to a preferred embodiment of the invention the impurity concentration varies locally and laterally with the at least first and second electrodes.

According to another preferred embodiment of the invention, the second electrode comprises a plurality of openings. When atomic, preferably hydrogen, intercalation is used for the preparation of gate graphene, these openings allow local penetration to the atoms or hydrogen in addition to penetration at the edges of the graphene layer. Therefore, it is possible to convert large areas of contact graphene to gate graphene selectively. Large areas of contact graphene layers without holes/openings cannot be converted at same time, only small portions at the edges will be converted to gate graphene.

According to another embodiment of the invention, a third electrode is disposed on the front surface of the substrate, the third electrode also being comprised of at least one epitaxial graphene monolayer. This allows the construction of active devices where for example one of these three electrodes is used for gating or controlling a current between the other two electrodes.

The invention allows integrated construction of active and passive electronic devices. According to one embodiment of the invention a transistor element is comprised, the transistor element having at least the first electrode, the second electrode and the third electrode, wherein the second electrode is disposed between the first and the third electrode on the front surface of the substrate. Preferably, the at least one epitaxial graphene monolayer of the second electrode is a gate graphene forming a Schottky barrier with the substrate. The first and the third electrode act as source and drain electrode. The current flow between the first and the third electrode through the substrate is controlled by the second (gate) electrode. Applying a voltage to the gate electrode changes the Schottky depletion layer in the substrate and therefore changes the current flow.

According to another preferred embodiment of the invention, a capacitor element is comprised. The capacitor element is constructed by at least one single second electrode and the substrate, having the capacitance of the Schottky depletion layer between the at least one epitaxial graphene layer of the second electrode and the substrate, or is constructed by at least two separated second electrodes, the two second electrodes adjoining each other, or is constructed by at least one single second electrode, a dielectric medium and a metal electrode, the dielectric medium being sandwiched between the second electrode and the metal electrode.

Preferably the electronic device comprises a resistor element, which is constructed by at least one strip of the at least one first or second electrode. The resistance of such a graphene strip is calculated from the known resistance of the graphene layer and the given length or geometry of the strip. One additional advantage of the invention in that context is that there is no contact resistance at a contact-gate-graphene junction. Therefore, gate graphene and contact graphene may be connected to each other without considering electric transport properties of a junction of both graphene types. Alternatively or additionally the resistance of the conductive layer within the substrate is used. To yield a defined resistance of the conductive layer the current path for example is spatially narrowed by a second electrode having a gate graphene layer or by a appropriate lateral doping profile.

In a preferred embodiment of the invention, the resistor strip has a meandering pattern. This allows a packed construction of the resistor element.

According to another embodiment of the invention the first electrode is substantially surrounded by the second electrode. The surrounding second electrode confines the current paths to and from the first electrode through the conductive layer of the substrate. A ring shaped second electrode for example is preferred when all possible current paths to and from the first electrode should be narrowed down in an off state of the device. The surrounding second electrode is also used to align the current flow within the conductive layer of the substrate.

Advantageously the electronic device comprises at least one conductor strip, which is formed by a second electrode strip or by a first electrode strip which is surrounded by a second electrode strip. Both embodiments avoid leakage currents through the substrate when connecting the graphene electrodes to said conductor strips electrically. Alternatively other metal strips may be used for the electrical connection of the graphene layers.

According to another preferred embodiment of the invention, the electronic device is an integrated circuit, wherein a plurality of first and second electrodes is comprised, at least two of these electrodes being electrically connected by a current path through the substrate.

BRIEF DESCRIPTION OF THE DRAWINGS

These and various other features of the present invention will become better understood upon reading of the following description of preferred embodiments in conjunction with the accompanying drawings.

DETAILED DESCRIPTION

Figure 1:
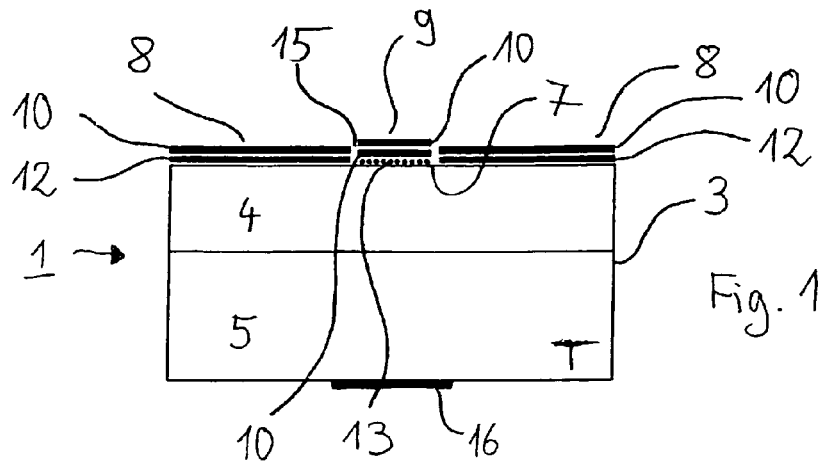
FIGS. 1-3 are schematic cross-sectional views of electronic devices with a gate graphene electrode disposed between two contact graphene electrodes on the front surface of a semiconductor substrate.
Figure 2:
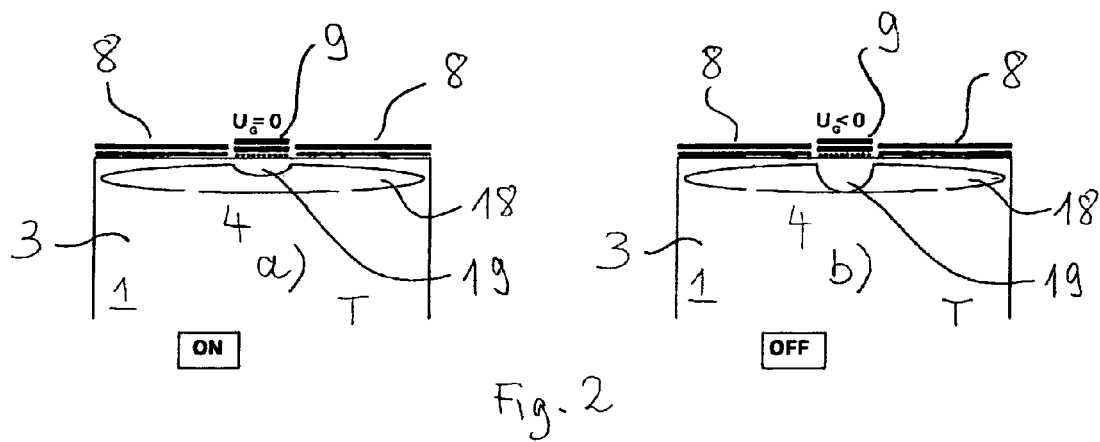
Figure 3:
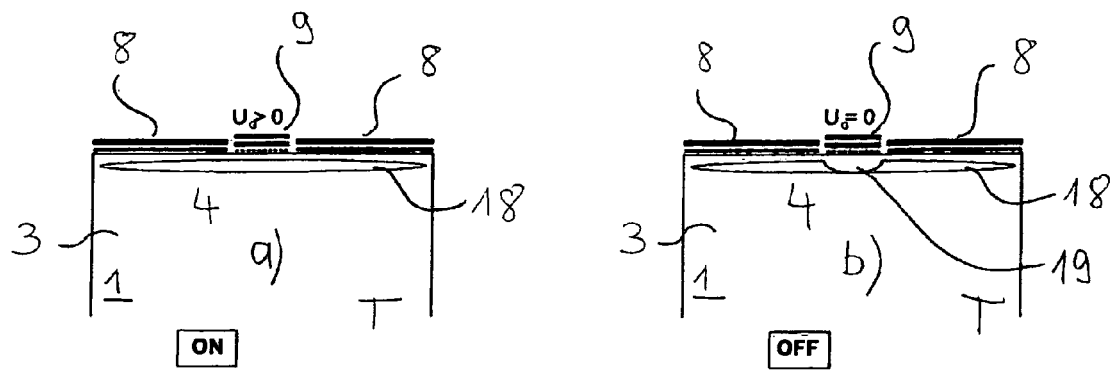

FIGS. 1-3 are schematic cross-sectional views of electronic devices 1 having a semiconductor substrate 3. The semiconductor substrate 3 comprises a first zone 4, which is doped with n-type impurities, and a second zone 5, which is doped with p-type impurities. Only the first zone 4 of the substrate 3 is shown in FIGS. 2 and 3.

On the front surface 7 of the substrate 3 two first electrodes 8 and a second electrode 9 are disposed. The second electrode 9 is disposed between the two first electrodes 8. The first and the second electrodes 8, 9 each comprise at least one epitaxial graphene monolayer 10. The at least one epitaxial graphene monolayer 10 of the first electrodes 8 is forming an ohmic contact with the substrate 3. Between the epitaxial graphene monolayer 10 of the first electrode 8 and the surface 7 of the substrate 3 a carbon buffer layer 12 is exhibited. The at least one epitaxial graphene monolayer 10 of the second electrode 9 and the substrate 3 are forming a Schottky diode. Between the epitaxial graphene monolayer 10 of the second electrode 9 and the surface 7 of the substrate 3 a hydrogen layer 13 is shown.

The substrate 3 for example is a silicon carbide, in particular a mono crystal silicon carbide. The front surface 7 for example is a silicon terminated surface of the silicon carbide crystal, especially the (0001)-surface. The invention however is not limited to a silicon carbide as substrate 3 and also other surfaces can be used as front surfaces 7 of the substrate 3.

The graphene layers 10 of the first electrodes 8 comprise so-called contact graphene layers. Contact graphene for example is prepared by thermal decomposition of a silicon terminated surface of silicon carbide. The graphene layer of the second electrode 9 comprises a so-called gate graphene layer. Gate graphene for example is prepared by hydrogen intercalation of contact graphene. Hydrogen saturates the dangling bonds of the surface 7 of the substrate 3. The carbon buffer layer 12 of a contact graphene is converted to a quasi free-standing graphene monolayer. Therefore, the gate graphene of the second electrode 9 is shown with two graphene monolayers 10 in FIGS. 1 to 3.

The shown devices 1 according to FIGS. 1 to 3 are transistor elements T. The first electrodes 8 act as source electrode and as drain electrode. The second electrode 9 is acting as gate electrode of the transistor element T.

At the boundary between the first n-type zone 4 and the second p-type zone 5 a depletion layer or space charge region is formed within the substrate 3. Depending on the concentration of the n-type and p-type impurities the vertical width of the space charge region varies and the vertical depth of an n-type conductive layer 18 underneath the surface 7 of the substrate 3 increases or decreases with a decreasing or increasing space charge region of the n-p-junction.

The electronic device 1 according to FIG. 2 is constructed as a "normally on"-device. The vertical depth of the n-type conductive layer 18 is large enough that the Schottky depletion layer 19 below the second gate graphene electrode 9 is not able to block the carrier transport within the conductive layer 18 between the first electrodes 8 (FIG. 2a).

If a negative voltage is applied to the second electrode 9, the Schottky depletion layer 19 expands spatially and is blocking the carrier transport within the conductive layer 18 between the first electrodes 8. The current path between the first electrodes 8 is completely narrowed down (FIG. 2b).

The electronic device 1 according to FIG. 3 is constructed as a "normally off"-device. The concentrations of the n-type and p-type impurities are chosen to get the space charge region at the n-p-junction within the substrate 3 broader towards the surface 7. The concentration of the n-type impurities is for example smaller than the concentration of the p-type impurities.

Having no voltage applied to the second electrode 9 (FIG. 3b), the Schottky depletion layer 19 blocks the carrier transport within the thin conductive layer 18 between the first electrodes 8. Applying a slightly positive voltage to the second electrode 9, the Schottky depletion layer 19 becomes removed. Between the first electrodes 8 a current flows within the n-type conductive layer 18 of the substrate 3.

If an additional (back) electrode 16 is mounted in electrical contact with the second zone 5 of the substrate 3 one single electronic device 1 can be switched between a "normally on"-and a "normally-off"-device. Applying a voltage to the back electrode 16 will move the space charge region of the n-p-junction within the substrate 3 in/along a vertical direction.

Figure 4:
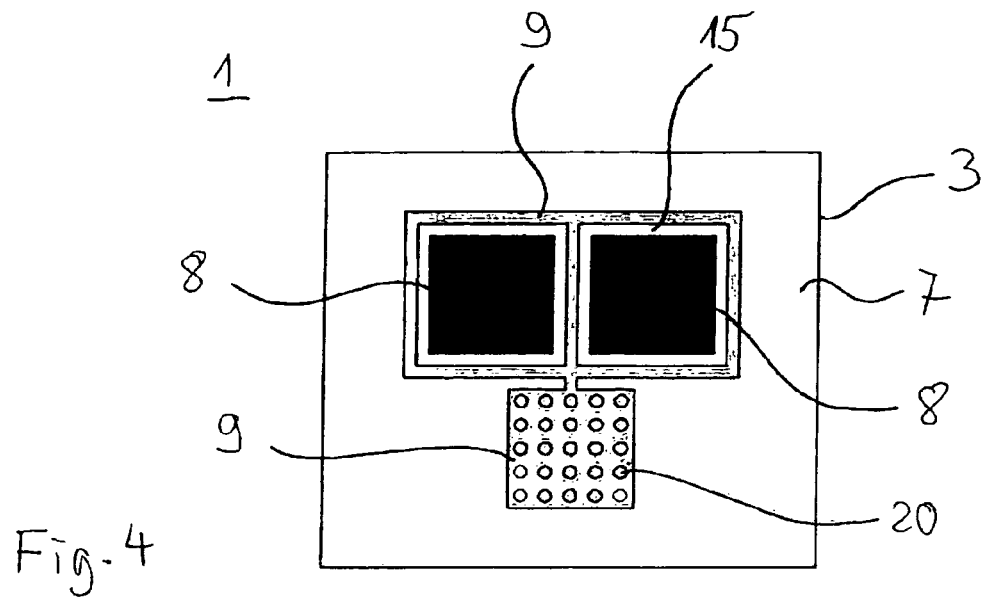
FIGS. 4-5 are schematic top views of electronic devices according to FIG. 1-3.

FIG. 4 shows a top view of an exemplary embodiment of the electronic devices 1 as shown in FIGS. 1 to 3. The two first electrodes 8 are substantially surrounded by strips of the second electrode 9. As the second electrode 9 is a gate graphene electrode, these strips of the second electrode 9 block a carrier transport through the conductive layer within the substrate 3 away from the first electrodes 8. In case of a "normally off"-device a locally decreased concentration of n-type impurities below the strip of the second electrode 9 between the first electrodes 8 is preferred. The square formed contact pad of the second electrode 9 comprises a plurality of holes 20. The patterns of the electrodes 8, 9 including the holes are optimized to prepare all electrodes 8, 9 as contact graphene in a first step and to convert the second electrode 9 by hydrogen intercalation to gate graphene in a second step. Due to the diffusion controlled conversion of contact graphene into gate graphene by hydrogen intercalation the small strips of the second electrode 9 and also the contact pad of the second electrode 9 having holes are converted earlier than the large areas of first electrodes 8. Stopping the hydrogen intercalation at this point of time, only the second electrode 9 and its corresponding strips are converted into gate graphene.

Figure 5:
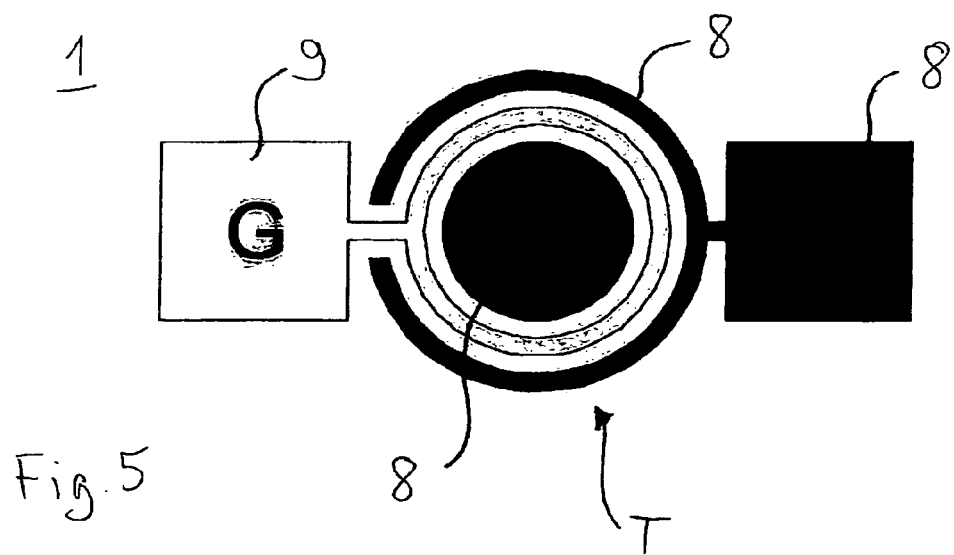

FIG. 5 shows a top view of another exemplary embodiment of an electronic device 1 as shown in FIGS. 1 to 3. All electrodes 8, 9 have broad contact pads. The first electrode 8, acting as source electrode S, is completely surrounded by a ring shaped strip of the second electrode 9, which acts as a gate electrode G. The ring shaped strip of the second electrode 9 is surrounded by another ring shaped strip of the other first electrode 8, which acts as drain electrode D. As explained with regard to FIGS. 1 - 4 the current flow between the two first electrodes 8 is controlled by applying a voltage to the second gate electrode 9.

The electrode pattern as shown in FIG. 5 is prepared by conversion of all electrodes 8, 9 from contact graphene to gate graphene (for example by hydrogen intercalation). Then, in a second step the first electrodes 8 are converted back into contact graphene by local laser heating.

Figure 6:
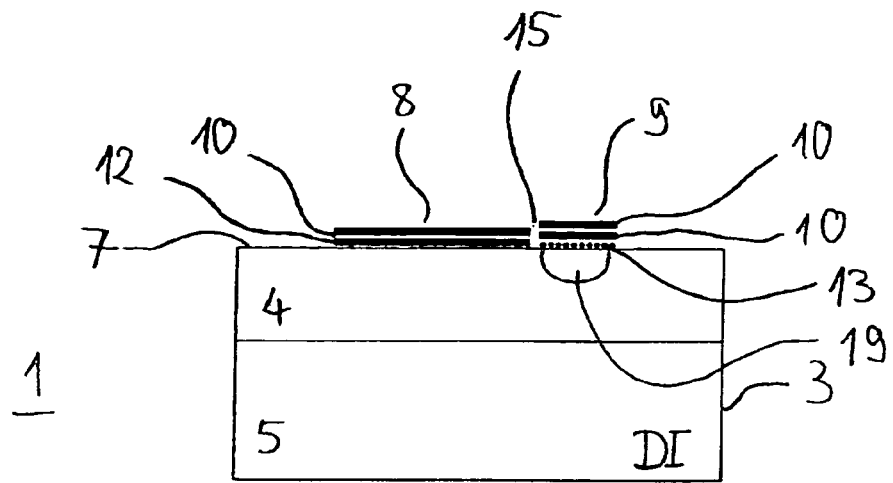
FIG. 6 is a schematic cross-sectional view of an electronic device with a gate graphene electrode and a contact graphene electrode disposed on the front surface of a semiconductor substrate.

FIG. 6 is a schematic cross-sectional view of an electronic device 1, acting as a single diode element DI. On the front surface 7 of the substrate 3 a first contact graphene electrode 8 is disposed adjoining a second gate graphene electrode 9. Both electrodes 8, 9 are separated from each other by a graphene free gap 15.

The electronic device 1 as shown in FIG. 6 has the function of a unidirectional diode. The Schottky depletion layer 19 below the second electrode 9 allows current flow only in one direction.

Figure 7:
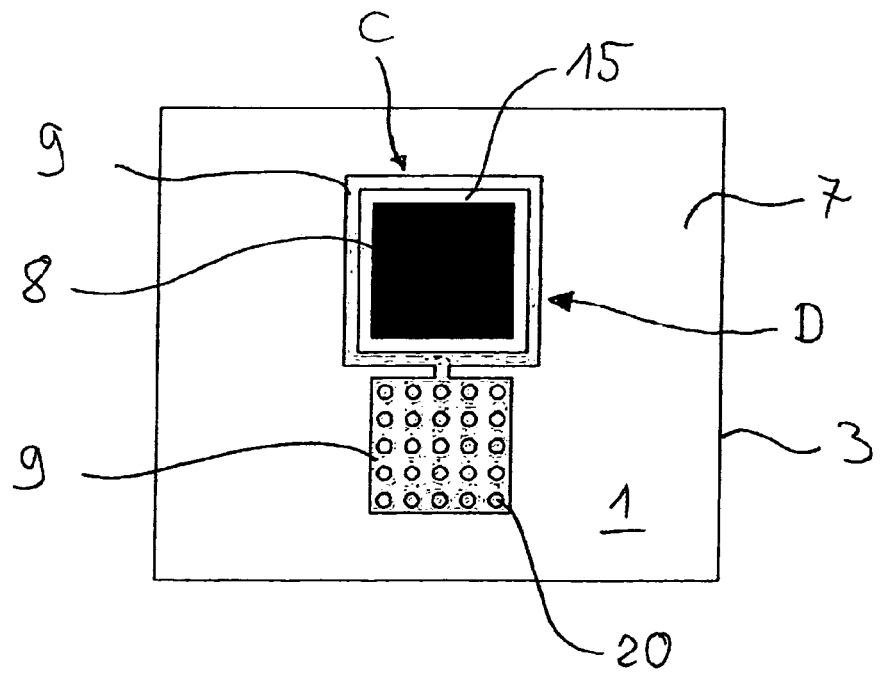
FIG. 7 is a schematic top view of an electronic device according to FIG. 6.

FIG. 7 is a top view of an exemplary embodiment of a diode device 1 according to FIG. 6. The first electrode 8 is surrounded by strips of the second electrode 9. The contact pad of the second electrode 9 comprises holes 20 to allow converting contact graphene into gate graphene by hydrogen intercalation. Additionally, the two adjoined electrodes 8, 9 form a capacitance. It is therefore possible to use to adjoined electrodes 8, 9 as a capacitor element C.

Figure 8:
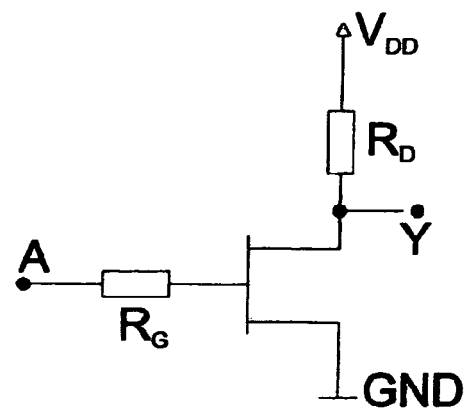
FIG. 8 is a circuit diagram of an inverter.

FIG. 8 is a circuit diagram of an electronic inverter. When a voltage $V_{dd}$ is applied to A, Y will be connected to ground. When applying ground to A, Y shows the voltage $V_{dd}$.

Figure 9:
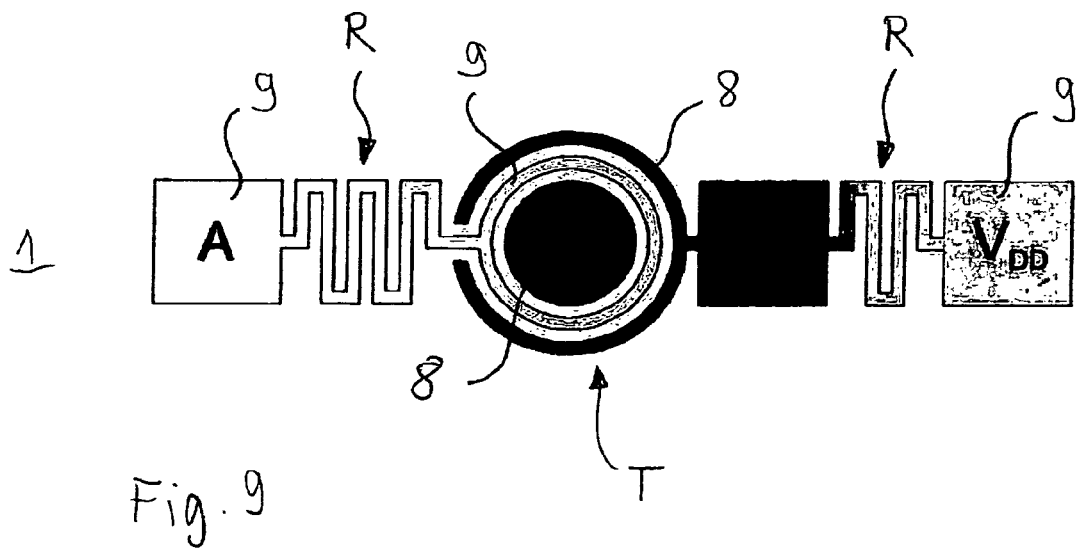
FIG. 9 is a schematic top view of an electronic device with a plurality of gate and contact graphene electrodes on the front surface of a substrate implementing the circuit diagram of FIG. 8.

FIG. 9 shows a top view of an exemplary embodiment for implementing the circuit as shown in FIG. 8 by using graphene electrodes on a semiconductor substrate. Two first electrodes 8 and a second electrode 9 in the middle are forming a transistor element T as shown in FIG. 5. The ring shaped gate electrode 9 is connected to contact pad A via a resistor element R. The resistor element R is constructed by a strip having a meandering pattern. The ring shaped drain electrode 8 of the transistor element T is connected to a contact pad Y. This contact pad Y is connected to a second electrode pad $V_{dd}$ via a second resistor element R, also formed by a meandering pattern. The doping profile of the substrate is chosen such that the transistor element T is "normally off".

Figure 10:
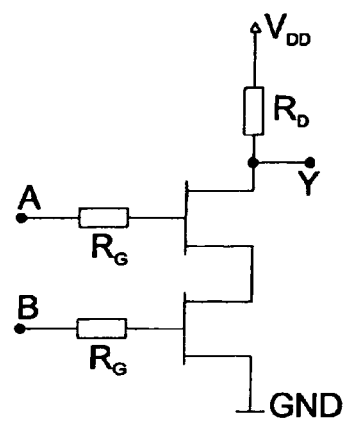
FIG. 10 is a circuit diagram of an electronic NAND-gate.

FIG. 10 shows a circuit diagram of a logical NAND-gate. Only in case of applying $V_{dd}$ to A and B, Y will be connected to ground.

FIGS. 11 to 14 show top views of exemplary embodiments for implementing the circuit as shown in FIG. 10 with graphene electrodes on the surface of a semiconductor substrate. The transistor elements T, T in the middle of all shown electrode patterns are drain-source-connected having two adjoined ring shaped second electrodes 9 between two first electrodes 8. The doping profile of the substrate is chosen such that the transistor element T, T is "normally off".

Figure 12:
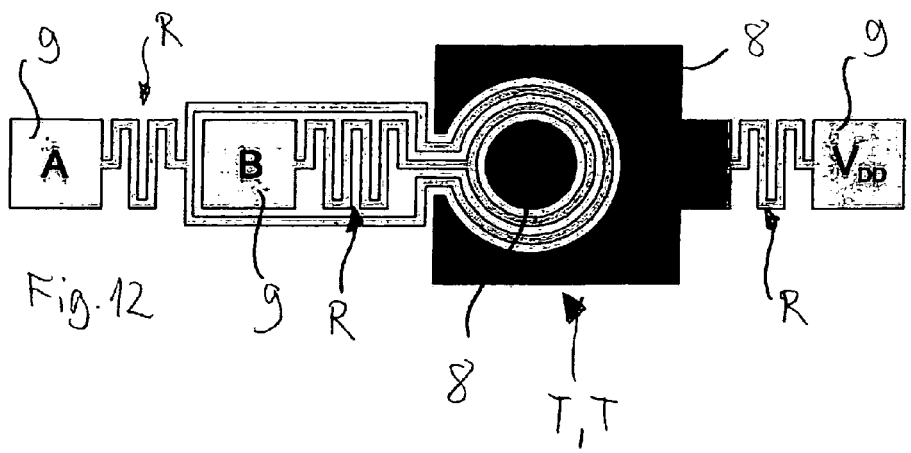
Figure 13:
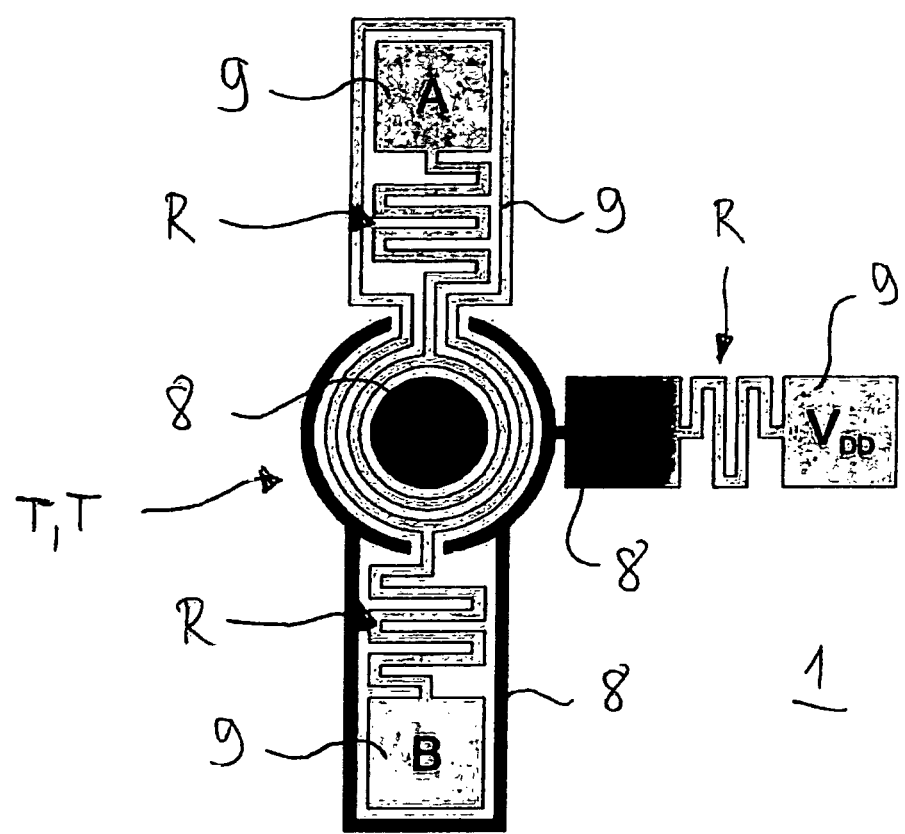
Figure 14:
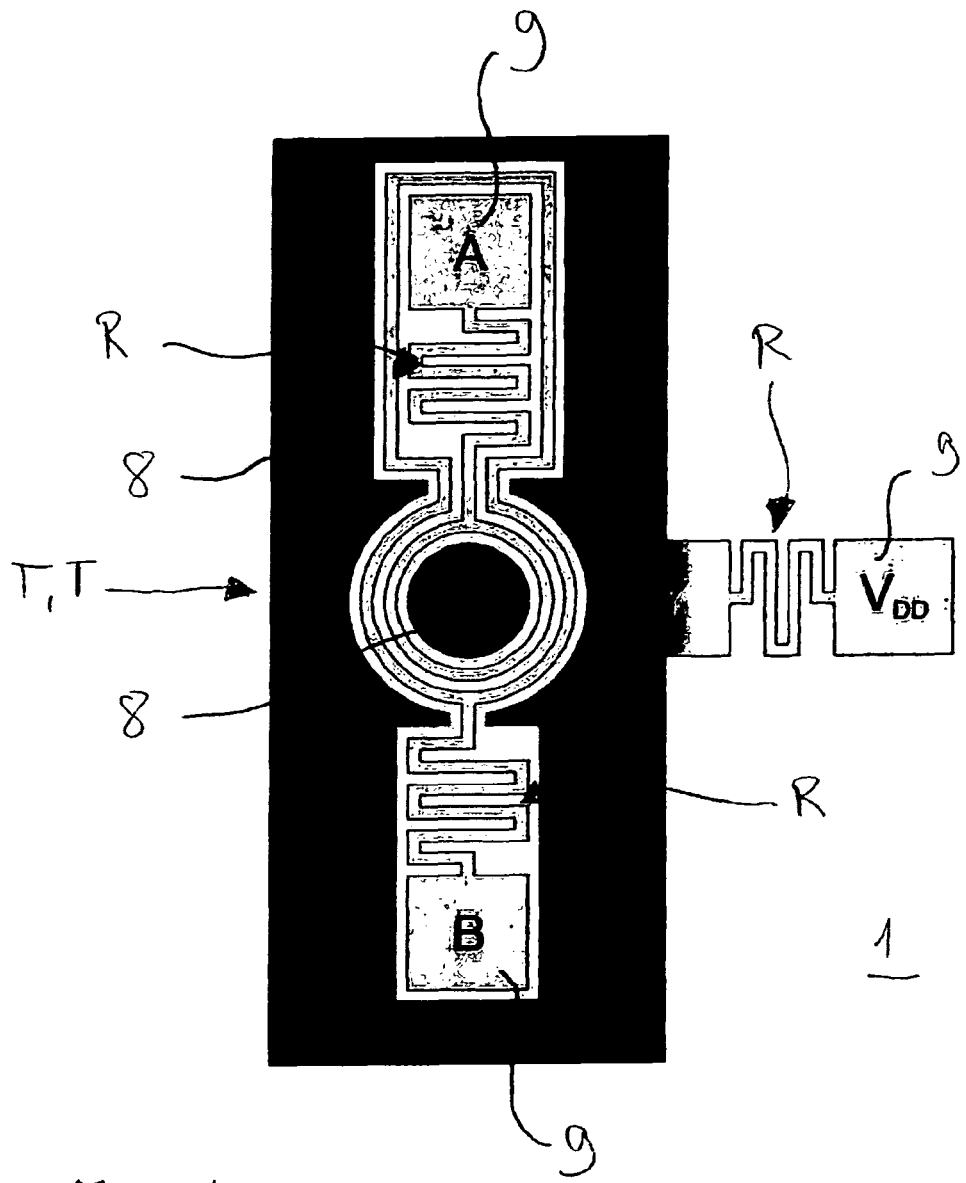

The electrode patterns according to FIGS. 13 and 14 are space optimized. The electrode patterns of FIGS. 12 and 14 are optimized to prepare the electrodes 8, 9 all as contact graphene electrodes in a first step and to convert the second electrodes 9 to gate graphene electrodes by hydrogen intercalation in a second step. For this purpose the contact pad of the second electrodes 9, having a larger area than the strips, do comprise holes, which are not shown.

Figure 11:
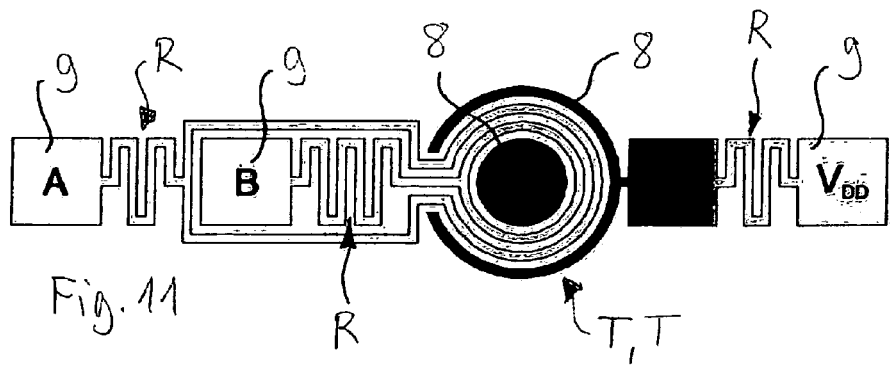
FIGS. 11-14 are schematic top views of electronic devices with a plurality of gate and contact graphene electrodes on the front surface of a substrate implementing the circuit diagram of FIG. 10.

The electrode patterns according to FIGS. 11 and 13 are optimized to prepare the electrodes 8, 9 all as gate graphene electrodes, for example by hydrogen intercalation of contact graphene, and then to convert the first electrodes 8 by local heating back to contact graphene electrodes.

Figure 15:
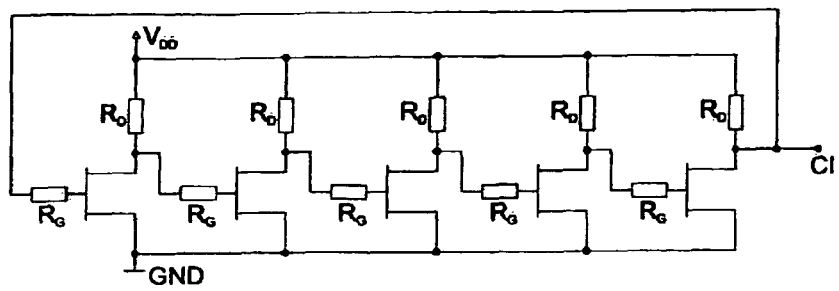
FIG. 15 is a circuit diagram of an electronic ring oscillator.

FIG. 15 shows a circuit diagram of a ring oscillator. A plurality of inverters such as shown in FIGS. 8 and 9 is cascaded. The first inverter switches the second inverter. The last inverter in the chain switches back the first inverter. This results in an oscillation of the output CI between $V_{dd}$ and ground with a specific measureable time constant.

Figure 16:
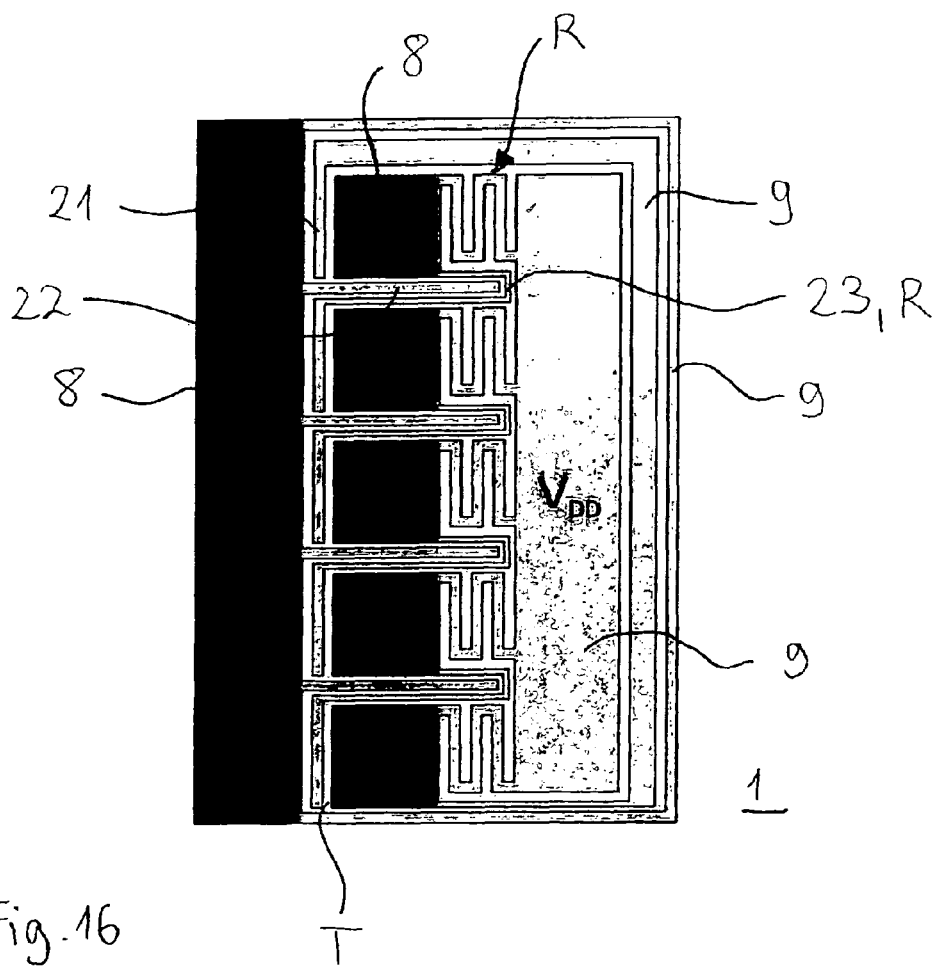
FIG. 16 is a schematic top view of an electronic device with a plurality of gate and contact graphene electrodes on the front surface of a substrate implementing the circuit diagram of FIG. 15.

FIG. 16 shows a top view of an exemplary embodiment of an implementation of the circuit according to FIG. 15 with a graphene electrode pattern on a semiconductor substrate. The broad contact pad for connecting ground to a first contact graphene electrode 8 and the broad contact pad for connecting $V_{dd}$ to a second gate graphene electrode 9 both are clearly shown. Also the square formed first electrodes 8 forming together with the ground electrode the source and drain electrodes of the cascaded transistors are clearly disclosed. The fingers 21 of the second electrodes 9 are forming the gate electrodes of the transistor elements T. The gate fingers 21 are disposed between two first contact graphene electrodes 8. The fingers 22 of the gate graphene electrodes 9 suppress unwanted cross-talk between the single transistor elements T. The source electrodes of the transistor elements T are connected with a small strip 23 adjoining the finger 22. Thereby, a defined resistance is created. The doping profile of the substrate is chosen such that the transistor elements T are "normally off".

Figure 17:
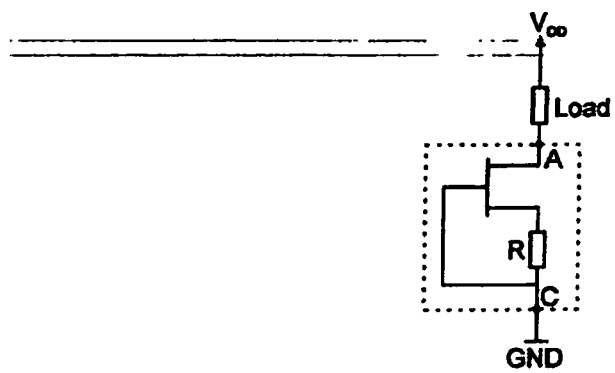
FIG. 17 is a circuit diagram of a current regulation diode (CRD) or current limiting diode (CLD)

FIG. 17 displays a circuit diagram of a current regulation diode (CRD) or current limiting diode (CLD), which can be used as a constant current source for a load, which is connected between the anode connector A and the power supply $V_{DD}$, while the cathode connector C is grounded.

Figure 18:
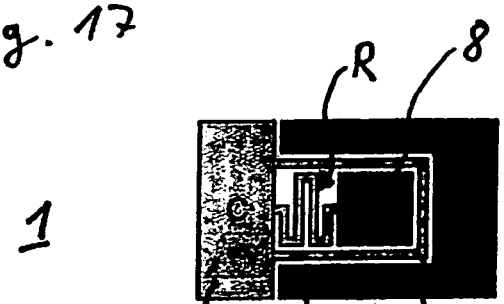
FIG. 18 is a schematic top view of an electronic device with a plurality of gate and contact graphene electrodes on the front surface of a substrate implementing the circuit diagram of FIG. 17.

FIG. 18 shows a top view of an exemplary embodiment of an implementation of the circuit according to FIG. 17 with a graphene electrode pattern on a semiconductor substrate. Two first electrodes 8 and a second electrode 9 in the middle are forming a transistor element T as shown in FIG. 5. The ring shaped gate electrode is connected to contact pad C (cathode). The inner first electrode 8 (source electrode) is connected to contact pad C via a resistor element R. The resistor element R is constructed by a strip having a meandering pattern. The outer first electrode 8 (drain electrode) of the transistor element T is connected to a contact pad A (anode). The doping profile of the substrate is chosen such that the transistor element T is "normally on".

LIST OF REFERENCE NUMERALS

1 Semiconductor Device
3 Semiconductor Substrate
4 First Zone (n-type)
5 Second Zone (p-type or semi-insulating)
7 Front Surface
8 First Electrode
9 Second Electrode
10 Epitaxial Graphene Monolayer
12 Carbon Buffer Layer
13 Hydrogen Layer
15 Graphene Free Gap
16 Back Electrode
18 n-type Conductive Layer
19 Schottky Depletion Layer
20 Holes
21 Gate Finger
22 Finger
23 Narrow Strip
T Transistor Element
R Resistor Element
DI Diode Element
C Capacitor Element

The invention claimed is:

1. An electronic device comprising:
   a semiconductor substrate having a front surface,
   a first electrode and a second electrode disposed on the front surface of the substrate, wherein the first electrode and the second electrode each comprises at least one epitaxial graphene monolayer,
   characterized in that
   the at least one epitaxial graphene monolayer of the first electrode is part of an ohmic contact with the substrate and
   the at least one epitaxial graphene monolayer of the second electrode is part of a Schottky barrier with the substrate.

2. The electronic device according to claim 1, wherein a carbon buffer layer is disposed between the at least one epitaxial graphene monolayer of the first electrode and the substrate, and wherein the surface of the substrate comprises a plurality of dangling bonds.

3. The electronic device according to claim 1, wherein an intercalated atomic layer is disposed between the at least one epitaxial graphene monolayer of the second electrode and the substrate.

4. The electronic device according to claim 3, wherein the intercalated atomic layer is a Hydrogen layer, a Fluor layer and/or a Gold layer.

5. The electronic device according to claim 1, wherein the semiconductor substrate is doped with impurities, and wherein the impurity concentration within the semiconductor substrate varies in/along a vertical direction.

6. The electronic device according to claim 5, wherein along the vertical direction the semiconductor substrate comprises at least a first zone adjoining the front surface and a second zone at a distance from the front surface, and wherein the substrate in the first zone and in the second zone is differently doped with different impurities.

7. The electronic device according to claim 6, wherein the substrate is doped with n-type impurities in the first zone, and wherein the substrate is doped with p-type impurities or is semi-insulating in the second zone.

8. The electronic device according to claim 6, wherein the substrate comprises an additional electrode, which is electrically connected with the second zone.

9. The electronic device according to claim 1, wherein the semiconductor substrate is doped with impurities, and wherein the impurity concentration within the semiconductor substrate varies in/along a horizontal direction.

10. The electronic device according to claim 9, wherein the impurity concentration varies in/along at least one horizontal direction with the at least first and second electrode.

11. The electronic device according to claim 1, wherein the semiconductor substrate is a silicon carbide (SiC).

12. The electronic device according to claim 11, wherein the silicon carbide is a single crystal silicon carbide, and wherein the front surface is on the Si terminated (0001) surface of the single crystal silicon carbide.

13. The electronic device according to claim 1, wherein the second electrode comprises a plurality of openings.

14. The electronic device according to claim 1, wherein the first electrode is substantially surrounded by the second electrode.

15. The electronic device according to claim 1, wherein a third electrode is disposed on the front surface of the substrate, the third electrode also being comprised of at least one epitaxial graphene monolayer.

16. The electronic device according to claim 15, wherein a transistor element comprises at least the first electrode, the third electrode, and the second electrode, wherein the second electrode is disposed between the first electrode and the third electrode on the front surface of the surface.

17. The electronic device according to claim 1, wherein a capacitor element comprises:
   at least one second electrode and the substrate, having the capacitance of the Schottky barrier between the at least one epitaxial graphene layer of the second electrode and the substrate,
   at least two separated second electrodes, the two second electrodes adjoining each other, and/or
   at least one second electrode, a dielectric medium, and a metal electrode, the dielectric medium being sandwiched between the second electrode and the metal electrode.

18. The electronic device according to claim 1, wherein a resistor element comprises at least one strip of the at least one first electrode or second electrode.

19. The electronic device according to claim 18, wherein the strip has a meandering pattern.

20. The electronic device according to claim 1, wherein at least one conductor strip comprises a second electrode strip or a first electrode strip which is surrounded by a second electrode strip.

21. The electronic device according to claim 1, wherein the epitaxial graphene monolayers of the first and second electrodes comprise crystallographic features corresponding to features of the surface of the substrate.

22. The electronic device according to claim 21, wherein:
the surface of the substrate corresponding to the first electrode comprises a plurality of dangling bonds;
a carbon buffer layer is disposed between the at least one epitaxial graphene monolayer of the first electrode and the substrate to form the ohmic contact with the substrate; and
an intercalated atomic layer is disposed between the at least one epitaxial graphene monolayer of the second electrode and the substrate to form the Schottky barrier with the substrate.

23. The electronic device according to claim 1, wherein:
the semiconductor substrate is a silicon carbide (SiC); and
the epitaxial graphene monolayers are produced by thermal decomposition of a silicon terminated surface of the SiC substrate.

24. The electronic device according to claim 23, wherein:
the epitaxial graphene monolayers formed by the thermal decomposition are contact graphene layers;
the at least one epitaxial graphene monolayer of first electrode is a contact graphene layer; and
the at least one epitaxial graphene monolayer of the second electrode is a gate graphene layer prepared by atomic intercalation of a corresponding contact graphene layer.

* * * * *